(12) United States Patent
Yamazaki et al.

(10) Patent No.: US 6,441,965 B2
(45) Date of Patent: Aug. 27, 2002

(54) LASER IRRADIATION APPARATUS

(75) Inventors: Shunpei Yamazaki, Tokyo; Koichiro Tanaka; Satoshi Teramoto, both of Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/932,769

(22) Filed: Aug. 16, 2001

Related U.S. Application Data

(63) Continuation of application No. 09/481,717, filed on Jan. 12, 2000, now Pat. No. 6,291,320, which is a continuation of application No. 08/810,492, filed on Feb. 28, 1997, now Pat. No. 6,038,075.

(30) Foreign Application Priority Data

Feb. 28, 1996 (JP) ................................................ 8-69394

(51) Int. Cl.$^7$ .............................................. G02B 27/10
(52) U.S. Cl. ...................... 359/623; 359/621; 359/622; 359/626
(58) Field of Search ................................ 359/619, 622, 359/623, 626

(56) References Cited

U.S. PATENT DOCUMENTS

| | | | |
|---|---|---|---|
| 3,667,832 A | 6/1972 | Kitano et al. ................ 356/175 |
| 4,475,027 A | 10/1984 | Pressley ..................... 219/121 |
| 4,733,944 A | 3/1988 | Fahlen et al. ................ 350/167 |
| 4,943,733 A | 7/1990 | Mori et al. .................. 250/548 |
| 5,097,291 A | 3/1992 | Suzuki ........................ 355/69 |
| 5,151,135 A | * 9/1992 | Magee et al. ................... 134/1 |
| 5,263,250 A | 11/1993 | Nishiwaki et al. .......... 29/890.1 |
| 5,303,084 A | * 4/1994 | Pflibsen et al. ............... 359/503 |
| 5,331,466 A | * 7/1994 | Van Saarloos ............... 359/723 |
| 5,521,748 A | * 5/1996 | Sarraf ......................... 359/321 |
| 5,561,081 A | 10/1996 | Takenouchi et al. ........ 437/174 |
| 5,619,245 A | * 4/1997 | Kessler et al. ............... 347/241 |
| 5,699,191 A | * 12/1997 | Fork ........................... 359/626 |
| 5,808,657 A | * 9/1998 | Kurtz et al. ................. 347/239 |
| 5,815,494 A | * 9/1998 | Yamazaki et al. ............. 372/25 |
| 5,858,822 A | * 1/1999 | Yamazaki et al. ........... 438/166 |
| 6,038,075 A | * 3/2000 | Yamazaki et al. ........... 359/626 |

FOREIGN PATENT DOCUMENTS

JP 410314970 A * 12/1998 ........... B23K/26/04

OTHER PUBLICATIONS

K.S. Pennington and J.M. White "CCD Imaging Array Combining Fly's–Eye Lens With TDI For Increased Light–Gathering Ability", IBM Technical Disclosure Bulletin, vol. 21 No. 2, Jul. 1978.

* cited by examiner

Primary Examiner—Ricky Mack
(74) Attorney, Agent, or Firm—Fish & Richardson P.C.

(57) ABSTRACT

There are disposed two homogenizers for controlling an irradiation energy density in the longitudinal direction of a laser light transformed into a linear one which is inputtted into the surface to be irradiated. Also, there is disposed one homogenizer for controlling an irradiation energy density in a width direction of the linear laser light. According to this, the uniformity of laser annealing can be improved by the minimum number of homogenizers.

12 Claims, 4 Drawing Sheets

LASER IRRADIATION APPARATUS

This application is a continuation of U.S. application Ser. No. 09/481,717, filed Jan. 12, 2000 now U.S. Pat. No. 6,291,320, which is a continuation of U.S. application Ser. No. 08/810,492, filed Feb. 28, 1997 now U.S. Pat. No. 6,038,075.

BACKGROUND OF THE INVENTION

1. Field of the Invention

The present invention relates to a laser light irradiation apparatus which has been improved in uniformity over an irradiated surface.

2. Description of the Related Art

In recent years, there is known a technique in which a crystalline silicon film is formed on a glass substrate and a thin film transistor is formed by using the crystalline silicon film.

As a method of obtaining a crystalline silicon film, there is known a technique in which an amorphous silicon film is first formed by a plasma CVD method or the like, and irradiation of a laser light is carried out to the amorphous silicon film to transform it into the crystalline silicon film.

An annealing method with this laser light irradiation is also used for annealing the source and drain regions of a thin film transistor formed in a self-aligned manner.

Although the method with the laser light irradiation is a technique capable of obtaining high crystallinity, there is a problem that the method is disadvantageous for a treatment of a large area.

However, in the case where an active matrix type liquid crystal display device having a large area is manufactured, there are no effective methods under the present situation other than the above-mentioned method of using the laser light.

SUMMARY OF THE INVENTION

It is an object of the invention to provide a technique in which laser light irradiation to a large area can be carried out with high uniformity. Also, another object of the invention is to provide a technique in which a crystalline silicon film having a large area is obtained by using such a laser light.

Also, it is still another object of the invention to provide a technique in which various kinds of annealing with irradiation of a laser light to a semiconductor device formed on a substrate having a large area can be carried out with high uniformity.

According to the study of the present inventors, it has been apparent that a method described below is effective as a method of annealing a silicon film having a large area. This method is such that a laser light is optically transformed into a linear beam having a width of several millimeters and a length of several tens centimeters, and the irradiation with this linear laser light is carried out while the scan therewith is carried out in the width direction thereof.

According to this method, laser light irradiation to a large area can be carried out by one scan. This method is superior in operation efficiency and uniformity of irradiation effect to a conventional method in which irradiation is carried out while scan to a spot with several centimeters square is sequentially carried out.

However, this method has a problem that the unevenness of laser irradiation density in the longitudinal direction of the linear laser beam is apt to become remarkable.

It is supposed that this problem is caused since the laser light with a width of several centimeters oscillated from an oscillator is optically enlarged into the length of several tens centimeters in the longitudinal direction of the linear laser beam.

On the other hand, in the width direction of the linear laser beam, since the laser beam with a width of several centimeters is reduced into the width of several millimeters, the uniformity in the width direction does not become a serious problem.

An apparatus for the linear laser beam irradiation is schematically shown in FIG. 4. FIG. 4 shows an oscillator 101 for oscillating a KrF excimer laser light, and a lens system of lenses 102 and 103 for optically transforming the laser light oscillated from the laser oscillator 101 into a predetermined laser beam.

Further, the laser beam from the lens system comprised of the lenses 102 and 103 is inputted into homogenizers 80 and 81 for homogenizing the distribution of energy density.

Furthermore, the laser beam from these two homogenizers 80 and 81 is inputted into a lens 106 for converging the beam in the width direction of the laser light to be finally transformed into a linear one.

Also, the laser beam is enlarged in the longitudinal direction of the linear laser light by a lens 107. Although the figure does not show that the laser beam is enlarged to a large degree as compared with the original laser beam, the laser beam with a dimension of several centimeters is actually enlarged into several tens centimeters.

Further, the laser light is reflected by a mirror 108, and is converged by a lens 109, then the beam as the linear laser light is irradiated onto a surface 100 to be irradiated.

In such a structure, the homogenizers 80 and 81 control the distribution of irradiation energy density of the irradiation laser beam.

The homogenizer 80 has a function to control the distribution of irradiation energy density in the width direction of the linear laser beam. The homogenizer 81 also has a function to control the distribution of irradiation energy density in the longitudinal direction of the linear laser beam.

Such a structure is basically for the case where square or circular laser beams are formed. That is, such a structure is effective for the case where, in the final irradiation of laser beam, the components of beam pattern in the axial directions orthogonal to each other are not much different from each other. As a conventional example of such a structure, there is known a structure disclosed in U.S. Pat. No. 4,733,944. The structure disclosed in this U.S. Patent is also an example for the case where the beam pattern in the axial directions orthogonal to each other is symmetrical.

However, when irradiation of a linear laser beam is carried out, the sectional shape of the beam in the longitudinal direction thereof is remarkably different from that of the beam in the width direction thereof. Accordingly, the state of distribution control of irradiation energy density to be obtained becomes different between the longitudinal direction and the width direction.

That is, the unevenness of irradiation energy density in the width direction of the linear laser light hardly becomes a problem because the width is narrow. However, the distribution of irradiation energy density in the longitudinal direction of the linear laser light becomes a serious problem because the dimension is largely enlarged. That is, control means for the distribution of irradiation energy density should be different for the respective directions.

The present invention disclosed in the present specification has been made on the basis of the above-described knowledge. The basic structure of the present invention is characterized in that the number of homogenizers for controlling the distribution of irradiation energy density in the longitudinal direction of a linear laser light is larger than that of homogenizers for controlling the distribution of irradiation energy density in the width direction of the linear laser light.

With this structure, there is obtained a laser irradiation apparatus in which the expensive homogenizers are effectively used to obtain necessary uniformity of annealing.

According to a first aspect of the invention, as specific structure thereof is shown in FIG. 1, a laser irradiation apparatus for irradiating a linear laser light comprises a homogenizer 11, A=1 in number, corresponding to the width direction of the linear laser light, and homogenizers 12 and 13, B=2 in number, corresponding to the longitudinal direction of the linear laser light, and is characterized by A<B.

In the above structure, the sum of A and B is an odd number.

According to another aspect of the invention, a laser irradiation apparatus for irradiating a linear laser light is characterized in that the number of homogenizers for controlling the irradiation energy density in the width direction of the linear laser light is different from that of homogenizers for controlling the irradiation energy density in the longitudinal direction of the linear laser light.

According to a still another aspect of the invention, a laser irradiation apparatus for irradiating a linear laser light is characterized in that the total number of homogenizers is an odd number.

DETAILED DESCRIPTION OF THE PREFERRED EMBODIMENT

Embodiment 1

Figure 1:
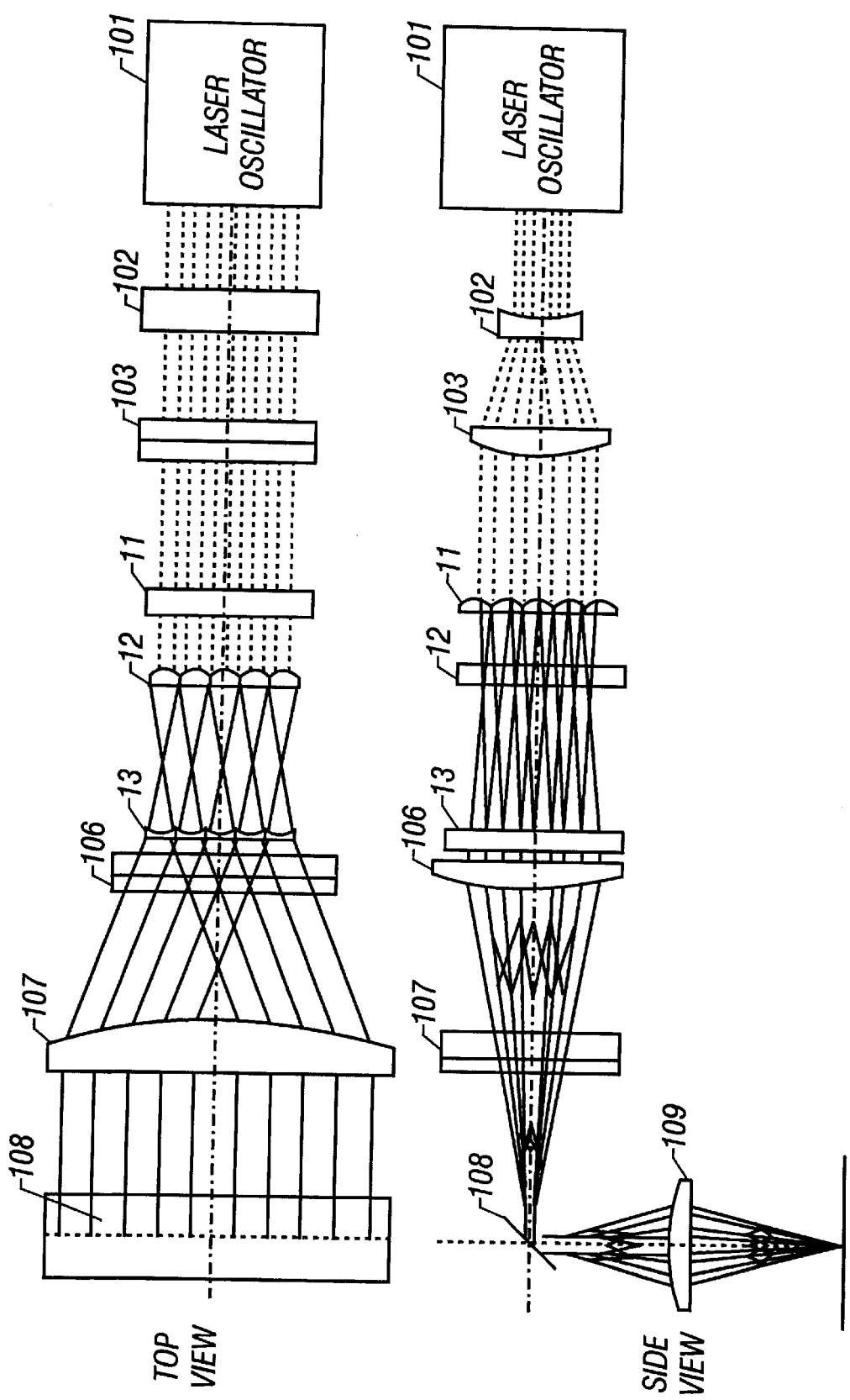
FIG. 1 is a schematic view showing a laser irradiation apparatus for irradiating a laser light.

FIG. 1 schematically shows a laser irradiation apparatus of this embodiment. In FIG. 1, a laser light oscillated from an oscillator 101 is first transformed into a laser light having a predetermined beam shape and predetermined energy density distribution by an optical system comprised of a lens 102 and a lens 103.

The distribution of energy density in this laser light is corrected by three homogenizers 11, 12, and 13.

The homogenizer 11 serves to correct the energy density of the beam in the width direction of the laser beam which is finally transformed into a linear one. However, since the dimension of the linear laser beam in the width direction is about several millimeters, the role of this homogenizer 11 is not so important.

In other words, the setting and adjustment of optical parameters of the homogenizer 11 is not required to be so delicate.

The homogenizers 12 and 13 serve to correct the energy density of the beam in the longitudinal direction of the laser beam which is finally transformed into the linear one.

The laser beam is extended in the longitudinal direction by more than 10 cm, the setting of optical parameters of these homogenizers 12 and 13 must be carefully carried out.

Here, as shown by reference numerals 12 and 13, two homogenizers for controlling the distribution of the irradiation energy density in the longitudinal direction of the laser beam are disposed to make the distribution of the irradiation energy density in the longitudinal direction of the laser beam more uniform.

Lenses designated by reference numerals 106, 107 and 109 serve to transform the laser beam into a linear one. That is, the lenses 106 and 109 serve to narrow the laser beam in the width direction. The lens 107 serves to enlarge the laser beam in the longitudinal direction in association with the two homogenizers 12 and 13.

In the structure shown in FIG. 1, the two homogenizers 12 and 13 control the irradiation energy density of the linearly transformed laser light in the longitudinal direction.

By using the two homogenizers in this way, the distribution of irradiation energy density in the longitudinal direction of the linear laser light can be made more uniform. Thus, the annealing effect by the linear laser light irradiation can be more uniformed. The number of the homogenizers may be increased, if necessary.

In the width direction of the linear laser beam in which high uniformity is not so required, one homogenizer is disposed to obtain the required uniformity.

Embodiment 2

Although this embodiment has basically the same optical system as that shown in FIG. 1, the settings of various optical parameters are slightly different.

Figure 2:
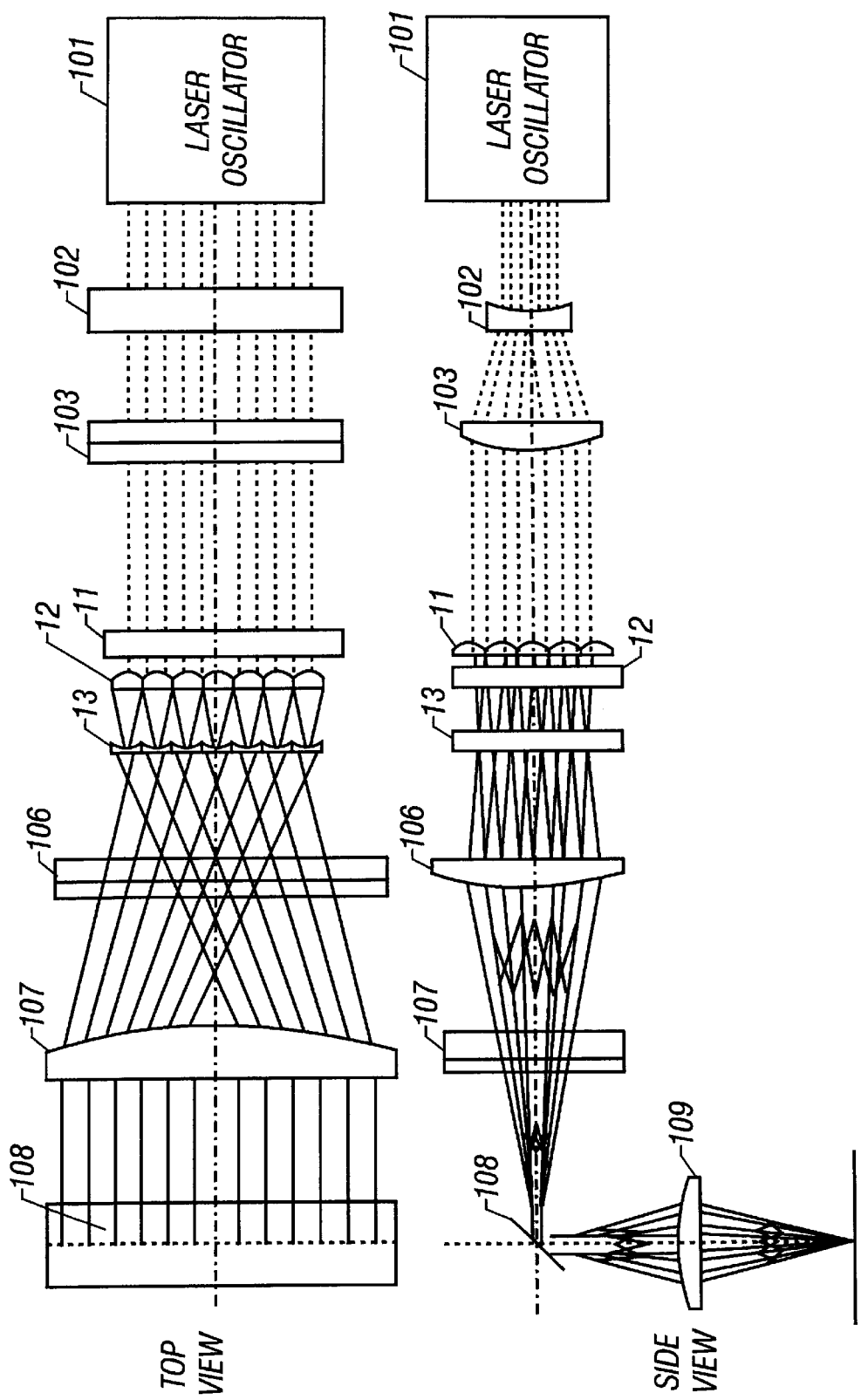
FIG. 2 is a schematic view showing a laser irradiation apparatus for irradiating a laser light.

FIG. 2 shows the structure of this embodiment. In the structure shown in FIG. 2, the positional relation between the homogenizers 12 and 13 is different from that shown in FIG. 1. In this case, in accordance with the change of the positional relation between the homogenizers 12 and 13, the settings of optical parameters of the respective lenses must be changed from the case shown in FIG. 1.

Also in the structure shown in FIG. 2, the uniformity of irradiation energy density in the longitudinal direction of the linear laser beam can be improved.

Embodiment 3

In this embodiment, there are shown steps of manufacturing a thin film transistor by applying the invention disclosed in the present specification.

A silicon oxide film or silicon oxynitride film 402 with a thickness of 3000Å as an underlying film is first formed on a glass substrate 401 by a sputtering method or plasma CVD method.

Next, an amorphous silicon film 403 with a thickness of 500Å is formed by the plasma CVD method or a low pressure thermal CVD method. In view of the denseness of film quality and crystallinity of a crystalline silicon film subsequently obtained, it is preferable to use the low pressure thermal CVD method as means for forming the amorphous silicon film 403.

In order to increase the annealing effect of laser light irradiation, the thickness of the amorphous silicon film 403 is preferably not larger than 1000Å, more preferably not larger than 500Å. The lower limit of the film thickness of the amorphous silicon film 403 is about 200Å.

Next, a metal element for promoting the crystallization of silicon is introduced. Here, Ni is used as the metal element for promoting the crystallization of silicon. Besides Ni, Fe, Co, Cu, Pd, Pt, Au, etc. may be used.

Figure 3A:
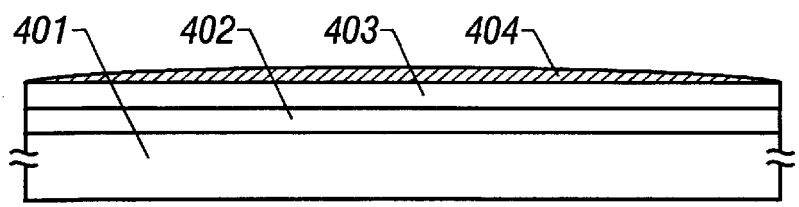
FIGS. 3(A) to 3(F) are views showing manufacturing steps of a thin film transistor.

Here, the Ni element is introduced by using a nickel acetate salt solution. Specifically, the nickel acetate salt solution having a predetermined Ni concentration (here, 10 ppm in terms of weight) is dropped on the surface of the amorphous silicon film 403. In this state, a water film 404 of the nickel acetate salt solution is formed (FIG. 3(A)).

Figure 3B:
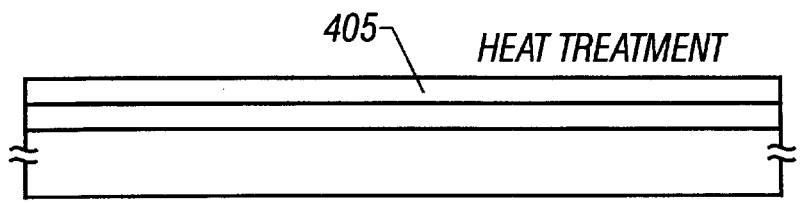

Next, spin-drying is carried out by using a spin coater (not shown) to blow off a superfluous solution. Further, heat treatment at 550° C. for four hours is carried out to obtain a crystalline silicon film 405 (FIG. 3(B)).

After the crystalline silicon film 405 is formed, irradiation of a laser light is then carried out. The crystallinity is further improved by this laser light irradiation. This laser annealing is carried out with the irradiation of a KrF excimer laser light, which is transformed into a linear beam, while the scan of the laser light is carried out. The laser light irradiation is carried out by using the apparatus shown in FIG. 1. That is, the apparatus irradiates the surface of the crystalline silicon film 405 with the linear laser light while scanning it in the width direction of the beam.

Figure 3C:
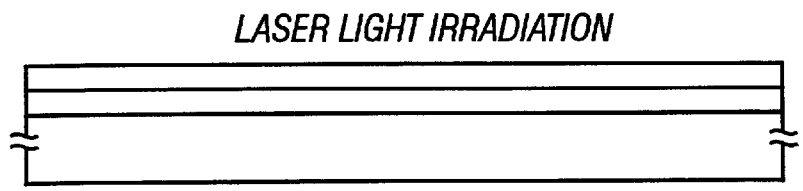

The crystalline silicon film 406 which has been improved in the crystallinity is further obtained by the laser annealing shown in FIG. 3(C).

Figure 3D:
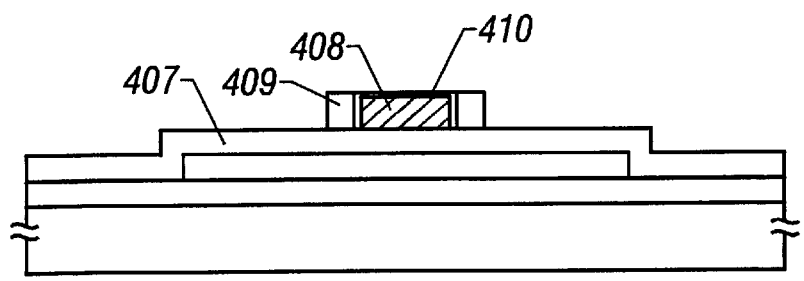

Next, patterning is carried out to form a region 406 which becomes an active layer of the thin film transistor (FIG. 3(D)).

Further, a silicon oxide film 407 functioning as a gate insulating film and covering the active layer 406 is formed. Here, a silicon oxide film with a thickness of 1,000Å as the gate insulating film 407 is formed by the plasma CVD method.

Next, an aluminum film (not shown) with a thickness of 5,000Å is formed to make a gate electrode. 0.1 wt. % scandium is contained in this aluminum film in order to suppress the formation of hillocks and whiskers in subsequent steps.

The hillocks and whiskers are needle-like or spine-like protrusions formed by abnormal growth of aluminum.

Next, a resist mask (not shown) is disposed, and using this mask, the aluminum film (not shown) is patterned. In this way, pattern for forming a gate electrode. 408 is formed. After the pattern for constituting the gate electrode 408 is formed, an anodic oxidation film is formed in the state that the resist mask (not shown) is disposed.

Here, a solution containing 3% nitric acid is used as an electrolytic solution. That is, in this solution, an electric current is flown between an anode of the pattern of the aluminum film (not shown) and a cathode of platinum to form the anodic oxidation film on the exposed surface of the pattern of the aluminum film.

The anodic oxidation film 409 formed in this step is porous. Here, since the resist mask (not shown) exists, this porous anodic oxidation film is formed on the side of the pattern as indicated by reference numeral 409.

The thickness of the porous anodic oxidation film is 3,000Å. An offset gate region can be formed by the thickness of this porous anodic oxidation film.

Next, the resist film (not shown) is removed, and anodic oxidation is again carried out. In this step, an ethylene glycol solution containing 3% tartaric acid neutralized with ammonia is used as an electrolytic solution.

The anodic oxidation film formed in this step has a dense film quality. In this step, a dense anodic oxidation film 410 with a thickness of 500Å is formed by adjusting an applied voltage.

Since the electrolytic solution intrudes into the interior of the porous anodic oxidation film 409, there is formed the anodic oxidation film 410 having the dense film quality in the state that it is brought into contact with the gate electrode 408.

If the film thickness of the anodic oxidation film 410 having the dense film quality is made thick, the additional thickness contributes to the subsequent formation of the offset gate region. However, since the thickness is thin in this embodiment, the contribution to the formation of the offset gate region will be neglected.

In this way, the state shown in FIG. 3(D) is obtained. After the state shown in FIG. 3(D) is obtained, impurity ion implantation is carried out to form source and drain regions. Here, P (phosphorus) ions are implanted to manufacture an N-channel thin film transistor (FIG. 3(E)).

Figure 3E:
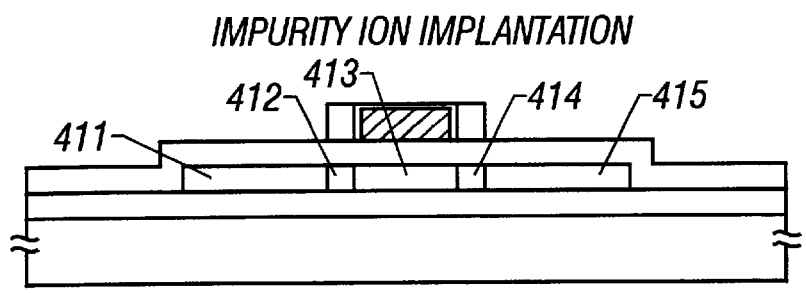

When the impurity ion implantation is carried out in the state shown in FIG. 3(E), impurity ions are implanted into regions 411 and 415. The impurity ions are not implanted into regions 412 and 414, which become regions not to be subjected to a field effect from the gate electrode 408. These regions 412 and 414 function as the offset gate region.

The region designated by reference numeral 413 becomes a channel forming region. In this way, the state shown in FIG. 3(E) is obtained.

After the above-mentioned impurity ion implantation is completed, laser light irradiation is carried out to activate the regions where the impurity ions are implanted. Also the laser light irradiation is carried out by using the laser irradiation apparatus including the optical system shown in FIG. 1.

After the state shown in FIG. 3(E) is obtained, an interlayer insulating film 416 is formed from a silicon oxide film, silicon nitride film, silicon oxynitride film, or the lamination film thereof as an interlayer insulating film.

Figure 3F:
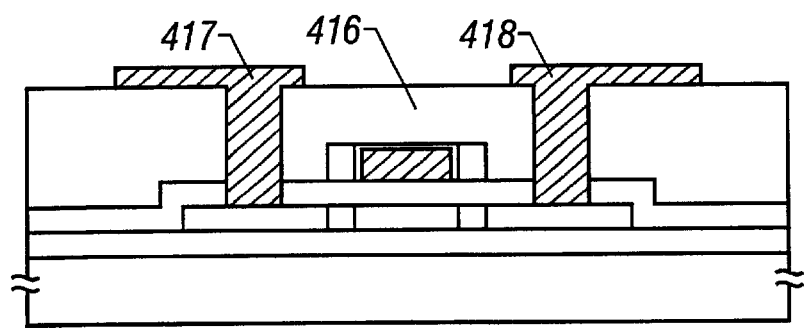
Figure 4:
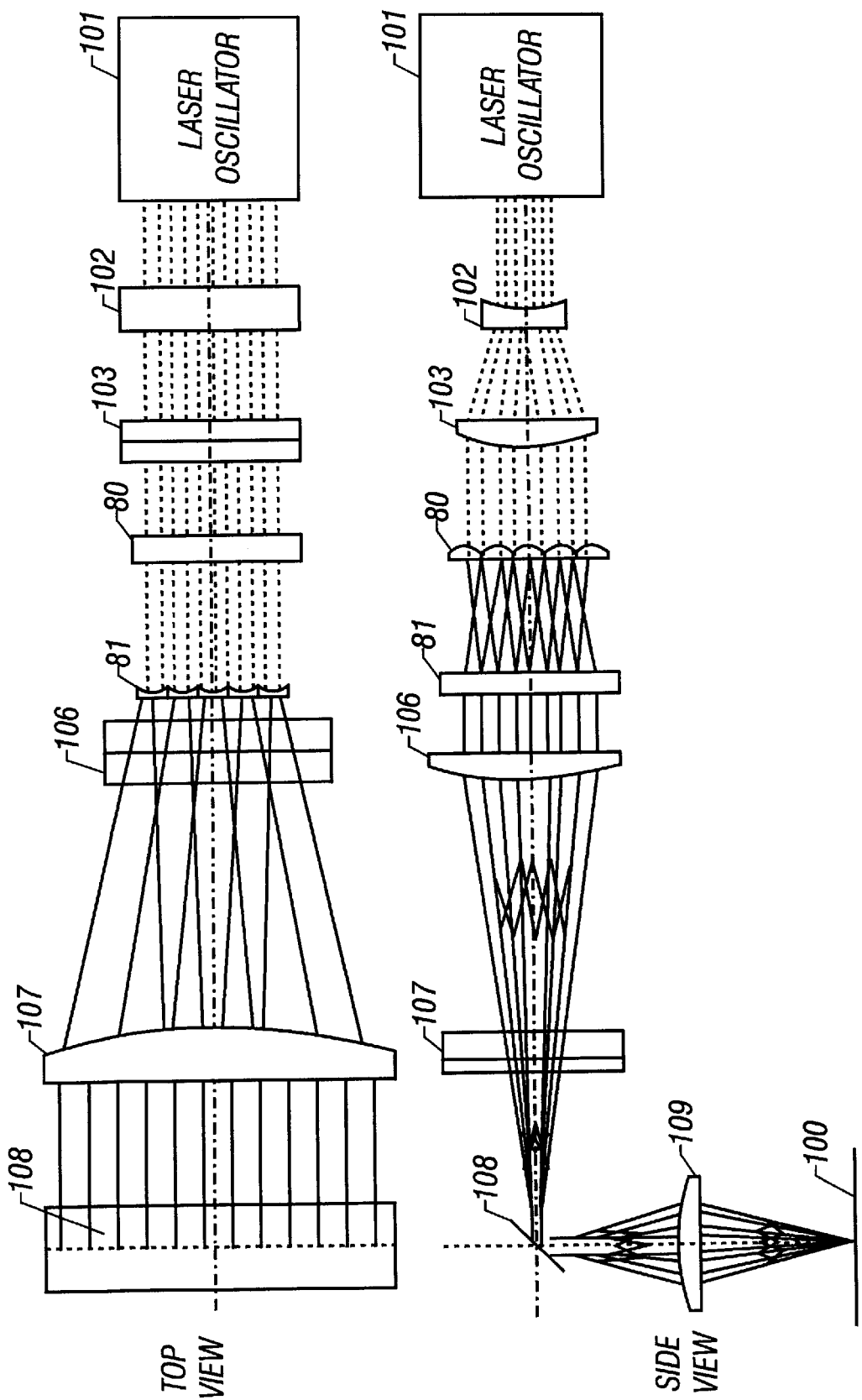
FIG. 4 is a schematic view showing a laser irradiation apparatus for irradiating a linear laser light.

Then, contact holes are formed, and a source electrode 417 and a drain electrode 418 are formed. In this way, the thin film transistor shown in FIG. 3(F) is completed.

By applying the invention disclosed in the present specification, it is possible to provide a technique in which irradiating a laser light with high uniformity onto a large area can be made. Further, annealing with high uniformity can be carried out to a semiconductor film having a large area. Especially, this effect can be obtained by the minimum use of expensive homogenizers.

What is claimed is:

1. A laser irradiation apparatus comprising:
   a laser for creating a laser;
   at least one first homogenizer for homogenizing an energy distribution of the laser in a width direction of a cross section of the laser; and
   at least two second homogenizer for homogenizing an energy distribution of the laser in a length wise direction of the cross section,
       wherein a number of the first homogenizer is smaller than a number of the second homogenizers.

2. An apparatus according to claim 1, wherein the sum of the number of the first homogenizer and the number of the second homogenizers is an odd number.

3. The laser irradiation apparatus according to claim 1 wherein said laser is an excimer laser.

4. A laser irradiation apparatus for crystallizing a semiconductor film, comprising:

a laser for creating a laser beam;

at least one first homogenizer for homogenizing an energy distribution of the laser beam in a width direction of a cross section of the laser;

at least two second homogenizers for homogenizing an energy distribution of the laser beam in a length wise direction of the cross section; and at least one cylindrical convex lens to condense the laser beam having been homogenized by said at least one first homogenizer and said at least two second homogenizers to a surface of a semiconductor film, wherein a number of the first homogenizer is smaller than a number of the second homogenizers.

5. An apparatus according to claim 4, wherein the sum of the number of the first homogenizer and the number of the second homogenizers is an odd number.

6. A laser irradiation apparatus for irradiating a linear laser light to a semiconductor, comprising:

a homogenizer or homogenizers, A in number, corresponding to a width direction of the linear laser light; and homogenizers, B in number, corresponding to a longitudinal direction of the linear laser light, wherein A<B, and wherein the semiconductor is responsive to the irradiation of the linear laser light to the semiconductor to cause annealing of the semiconductor.

7. An apparatus according to claim 6 wherein crystallinity of the semiconductor is improved by the annealing.

8. The laser irradiation apparatus according to claim 6 wherein said linear laser light is an excimer laser.

9. A laser irradiation apparatus for irradiating a linear laser light, wherein the number of homogenizers for controlling an irradiation energy density in a width direction of the linear laser light is different from that of homogenizers for controlling an irradiation energy density in a longitudinal direction of the linear laser light, a laser irradiation apparatus for irradiating a linear laser light, wherein the total number of homogenizers is an odd number, wherein the number of homogenizers for controlling an irradiation energy density in a longitudinal direction of the linear laser light is larger than that of homogenizers for controlling an irradiation energy density in a width direction of the linear laser light.

10. The laser irradiation apparatus according to claim 9 wherein said linear laser light is an excimer laser.

11. A laser irradiation apparatus for irradiating a linear laser light to a semiconductor, wherein the number of homogenizers for controlling an irradiation energy density in a width direction of the linear laser light is different from that of homogenizers for controlling an irradiation energy density in a longitudinal direction of the linear laser light, and wherein the semiconductor is responsive to the irradiation of the linear laser light to the semiconductor to cause annealing of the semiconductor.

12. The laser irradiation apparatus according to claim 8 wherein said linear laser light is an excimer laser.

* * * * *